(12) United States Patent
Bishop et al.

(10) Patent No.: US 6,735,081 B1
(45) Date of Patent: May 11, 2004

(54) THERMAL MANAGEMENT APPARATUS FOR HORIZONTAL ELECTRONICS ENCLOSURES

(75) Inventors: Michael Bishop, Nepean (CA); Edward Chen, Manotick (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/445,753

(22) Filed: May 27, 2003

(51) Int. Cl.[7] ................................................ H05K 7/20
(52) U.S. Cl. ...................... 361/695; 361/694; 361/697; 174/16.1; 174/16.3; 165/80.3; 165/104.33; 454/184
(58) Field of Search ................................ 361/690–697, 361/715–721; 174/16.1, 16.3; 165/80.3, 104.33, 122; 454/184

(56) References Cited

U.S. PATENT DOCUMENTS

| 5,467,251 A | | 11/1995 | Katchmar | |
|---|---|---|---|---|
| 5,946,188 A | * | 8/1999 | Rochel et al. | 361/690 |
| 5,949,646 A | * | 9/1999 | Lee et al. | 361/695 |
| 6,011,689 A | * | 1/2000 | Wrycraft | 361/689 |
| 6,042,474 A | * | 3/2000 | Harvey et al. | 454/184 |
| 6,587,340 B2 | * | 7/2003 | Grouell et al. | 361/695 |

* cited by examiner

*Primary Examiner*—Boris Chervinsky
(74) *Attorney, Agent, or Firm*—Guerin & Rodriguez, LLP; William G. Guerin

(57) ABSTRACT

A reconfigurable apparatus for thermal management of an electronics module is described. The apparatus includes a pair of fans generating airflow along respective fan axes. The apparatus also includes a beat sink having one portion disposed in the airflow of the fans and another portion adapted for thermal coupling with the electronics module. The airflows from the fans are in the same direction when the apparatus is arranged in a front-to-back airflow configuration and the airflows are in opposite directions when the apparatus is arranged in a front-to-front airflow configuration. A removable flow director is included in the apparatus when the apparatus is in the front-to-front airflow configuration to direct the airflow from the first fan towards the second fan.

10 Claims, 4 Drawing Sheets

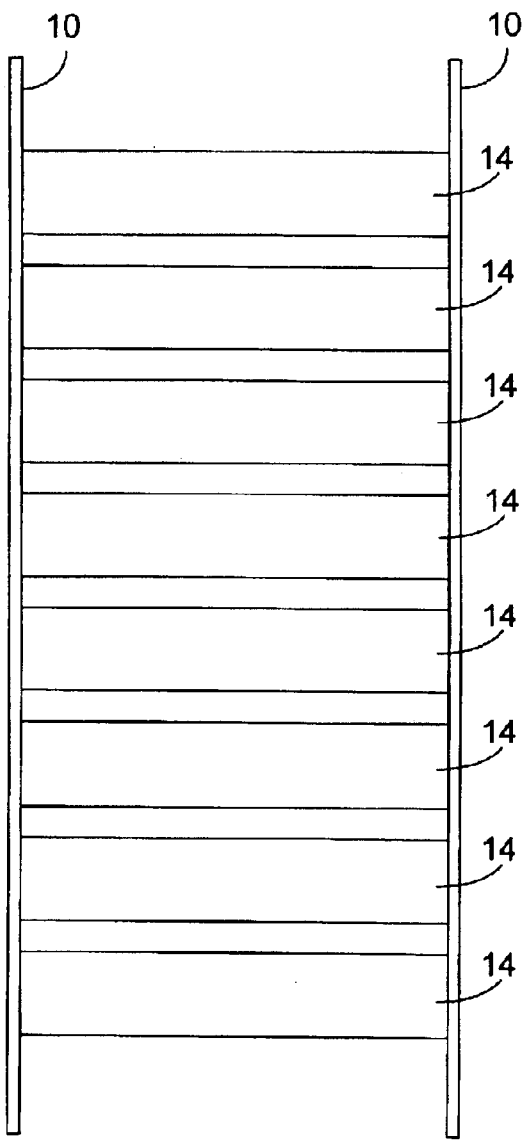
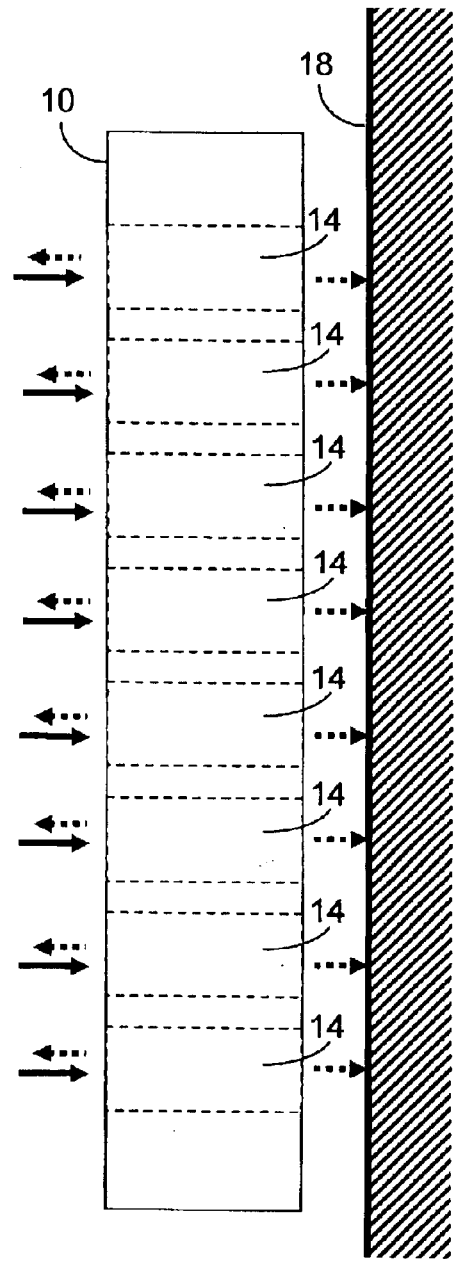
FIG. 1A             FIG. 1B

THERMAL MANAGEMENT APPARATUS FOR HORIZONTAL ELECTRONICS ENCLOSURES

FIELD OF THE INVENTION

The invention relates generally to thermal management of electronics enclosures. More particularly, the invention relates to a reconfigurable apparatus for thermal management of horizontal enclosures.

BACKGROUND

Electronic equipment can generate significant heat during operation. The performance of the equipment is typically affected by temperature. Performance may become unreliable if the electronics are subject to high temperatures or large temperature variations. The thermal management of electronic enclosures is becoming increasingly challenging as the power density of the electronics increases. For example, a common form factor for communications equipment enclosures is the horizontal box or "pizza box". Such enclosures are particularly challenging because the only accessible surfaces for air cooling are the front and rear panels. For some applications, only the front panel is useful for air cooling due to the mounting of the enclosure relative to other enclosures or adjacent walls. Moreover, the enclosure size must be maintained to preserve the number of enclosures that can be deployed in a fixed space. The thermal management of these enclosures has to be effective, affordable and reliable.

Generally, cooling is achieved by providing airflow across the electronics to remove excess heat. The airflow can introduce dust and other contaminants into the electronics environment, potentially leading to failure of the electronic components. Air filters are sometimes used to limit the dust and particulates, however, the power, size and cost of the fans are generally increased to maintain the cooling efficiency. Moreover, air filters require periodic cleaning or replacement.

Accordingly, there exists a need for a thermal management apparatus that meets the requirements described above. The present invention satisfies these needs and provides additional advantages.

SUMMARY OF THE INVENTION

In one aspect, the invention features an apparatus for thermal management of an electronics module. The apparatus includes a first fan to generate an inlet airflow and an exhaust airflow along a first fan axis, and a second fan to generate an inlet airflow and an exhaust airflow along a second fan axis. A flow director is disposed on the first fan axis to redirect the exhaust airflow of the first fan to the second fan along the second fan axis. The apparatus also includes a heat sink having a first portion disposed in one or both of the exhaust airflow of the first fan and the inlet airflow of the second fan. The heat sink also has a second portion that can be thermally coupled with the electronics module. The apparatus also includes an enclosure surrounding the heat sink and the electronics module. The heat sink and the enclosure define a first volume and a second volume. The first volume includes the exhaust airflow of the first fan and the inlet airflow of the second fan. The second volume includes the electronics module and is isolated from the airflows generated by the first and second fans.

In one embodiment the apparatus also includes a first louver disposed in the inlet airflow of the first fan and a second louver disposed in the exhaust airflow of the second fan. The first louver is configured at a first angle with respect to the first and second fan axes and the second louver is configured at a second angle with respect to the first and second fan axes that is opposite the first angle. The inlet airflow of the first fan and the exhaust airflow of the second fan are thereby spatially separate.

In another aspect, the invention features a reconfigurable apparatus for thermal management of an electronics module. The reconfigurable apparatus includes a first fan and a second fan generating an airflow along a first fan axis and a second axis, respectively. The second fan axis is substantially parallel to the first fan axis. The airflow from the second fan is in the same direction as the airflow from the first fan when the reconfigurable apparatus is in a first configuration. The airflow from the second fan is in an opposite direction to the airflow from the first fan when the reconfigurable apparatus is in a second configuration. The reconfigurable apparatus also includes a removable flow deflector disposed on the first fan axis when the reconfigurable apparatus is in the second configuration. The removable flow director directs the airflow of the first fan to the second fan along the second fan axis. The reconfigurable apparatus also includes a heat sink having a first portion disposed in one or both of the airflow of the first fan and the airflow of the second fan. The heat sink has a second portion that can be thermally coupled to the electronics module.

In one embodiment the reconfigurable apparatus also includes an enclosure surrounding the heat sink and the electronics module. The heat sink and the enclosure define a first volume and a second volume. The first volume includes the airflows generated by the first and second fans and the second volume includes the electronics module. In another embodiment the heat sink includes a thermal spreader plate that separates the first volume and the second volume. In yet another embodiment the reconfigurable apparatus includes a first louver and a second louver. The first louver is disposed on the first fan axis and is configured at a first angle with respect to the first and second fan axes. The second louver is disposed on the second fan axis and is configured at a second angle with respect to the first and second fan axes that is opposite the first angle so that an airflow exhausted through the second louver does not interfere with the airflow received at the first louver.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 1A is a front view of a rack of electronics enclosures.

FIG. 1B is a side view of the rack of electronics enclosures of FIG. 1A.

DETAILED DESCRIPTION

Figure 2A:
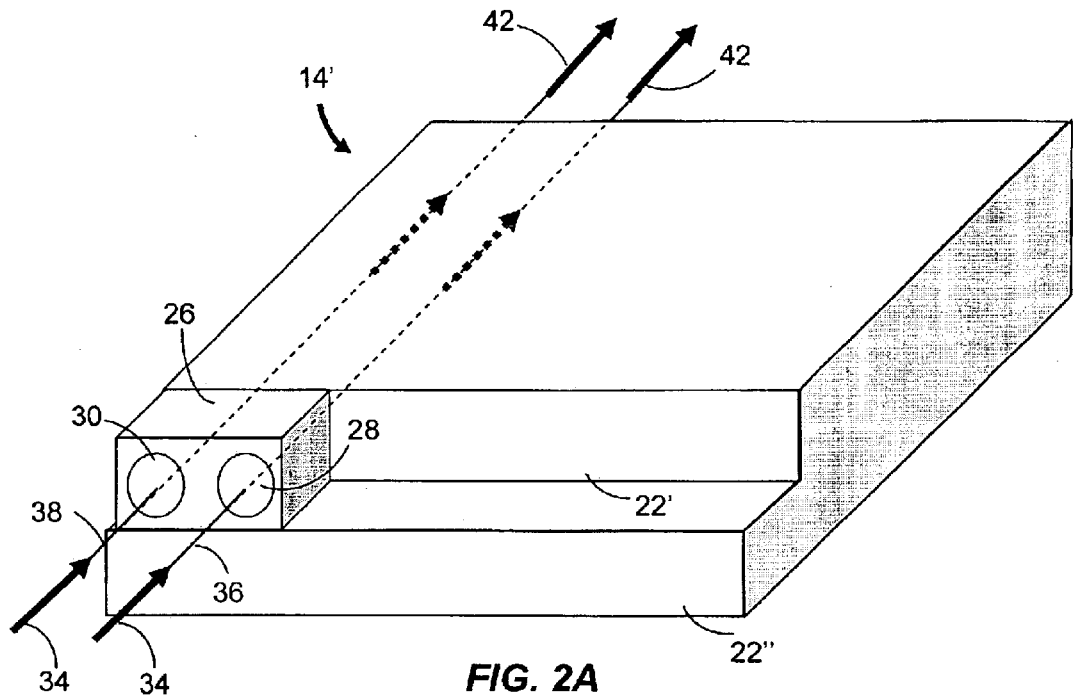
FIG. 2A is an illustration of an electronics enclosure having an embodiment of a thermal management apparatus to provide a front-to-rear airflow in accordance with the present invention.

In brief overview, the invention is directed to a reliable and cost-effective apparatus for thermal management of an electronics enclosure. The apparatus does not require air filters and thus eliminates the need for filter maintenance. The apparatus allows for front-to-rear and front-to-front airflow configurations in a single electronics enclosure. In addition, enclosure size is not substantially affected by the thermal management apparatus. The apparatus can be used with any electronics enclosures, including enclosures having any combination of electronic, optical and mechanical devices that are a source of heat.

FIGS. 1A and 1B illustrate front and side views, respectively, of a portion of a rack 10 containing multiple electronics enclosures 14. The enclosures 14 are closely spaced vertically (e.g., tenths of an inch separation) and have a horizontal box or "pizza box" form. Many enclosures 14 are typically mounted in the rack 10. For example, each enclosure 14 may be less than 17 inches wide, 10 inches deep and 1.7 inches high and as many as 44 enclosures 14 can be provided in a seven foot high rack 10. The enclosures 14 are cooled by generating an inlet airflow (solid arrows) into each enclosure from one side of the enclosure 14 and exhausting heated air (dashed arrows pointing to the right) out the opposite side of the enclosure 14. In the illustration, a wall 18 located close to the rack 10 near the rear of the enclosures 14 obstructs the heated exhaust airflow. In another arrangement, racks are placed back-to-back resulting in heated exhaust airflows that are incident on other enclosures 14. In either arrangement, the front-to-rear airflow is restricted and the enclosures 14 cannot be maintained at an acceptable temperature. Cooling is achieved instead by providing the inlet airflow (solid arrows) through the front of the enclosure 14 and exhausting the heated airflow (dashed arrows pointing to the left) back through the front of the enclosure 14. Advantageously, the thermal management apparatus of the present invention does not result in a significant change in size for the enclosures 14. Consequently, the number of enclosures 14 within the rack 10 (i.e., the density of enclosures 14) is unaffected by the thermal management apparatus.

FIG. 2A illustrates an electronics enclosure 14' having a general pizza box form factor with a two part front face, or front panel, 22' and 22". The enclosure 14' is configured for a front-to-rear airflow. A fan module 26 has two fans 28 and 30 attached to the enclosure 14' at one or more openings in the front panel 22'. Each fan 28, 30 operates in parallel to generate an inlet airflow (depicted as solid arrows 34) along fan axes 36 and 38, respectively. The inlet airflow 34 passes through the fins of a heat sink (not shown) inside the enclosure 14'. The heat sink is thermally coupled to the internal electronic components and modules to provide cooling as described below. The heated airflow (depicted as solid arrows 42) is exhausted through the back panel (not shown) of the enclosure 14'.

Figure 2B:
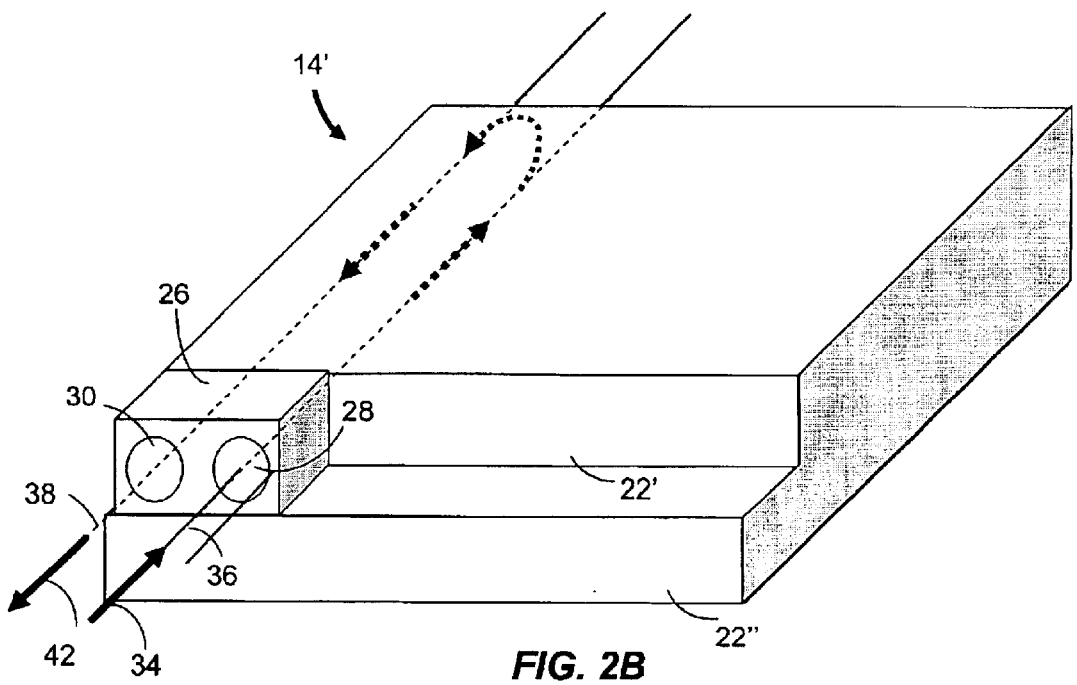
FIG. 2B is an illustration of the electronics enclosure of FIG. 2A configured to provide a front-to-front airflow.

FIG. 2B illustrates the electronics enclosure 14' of FIG. 2A configured for a front-to-front airflow. In this configuration the two fans 28, 30 are arranged in a serial fashion. Inlet fan 28 generates an inlet airflow 34 from front to rear along fan axis 36. The inlet airflow 34 passes between some of the fins of the heat sink. The outlet fan 30 rotates in the opposite direction to the inlet fan to blow air out of the enclosure 14'. Thus the airflow 34, 42 turns within the enclosure 14', passes between additional fins of the heat sink and exits through the front panel 22'. Thus the fans 28, 30 in this configuration operate in a push-pull fashion. A flow director (not shown) located inside the enclosure 14' assists in redirecting the front-to-rear airflow along fan axis 36 to a rear-to-front airflow along fan axis 38. The cooling capacity of the front-to-front configuration is less than that for the front-to-rear configuration of FIG. 2A because the total airflow is less. Thus the maximum acceptable heat generation of the enclosed electronics is less for the front-to-front configuration.

The redundant fan arrangement provides for a highly reliable thermal management apparatus. If one of the fans 28, 30 in the front-to-rear configuration of FIG. 2A fails to operate, the other fan 28, 30 continues to generate an inlet airflow 34 sufficient to maintain adequate cooling and continued operation of the enclosed electronics. If the inlet fan 28 in the front-to-front configuration of FIG. 2B fails to operate, the outlet fan 30 continues to pull sufficient air across the heat sink to maintain adequate cooling and continued operation of the enclosed electronics system. Similarly, if the outlet fan 30 fails to operate, the inlet fan 28 continues to push enough air across the heat sink for adequate thermal control and electronics operation.

Figure 3:
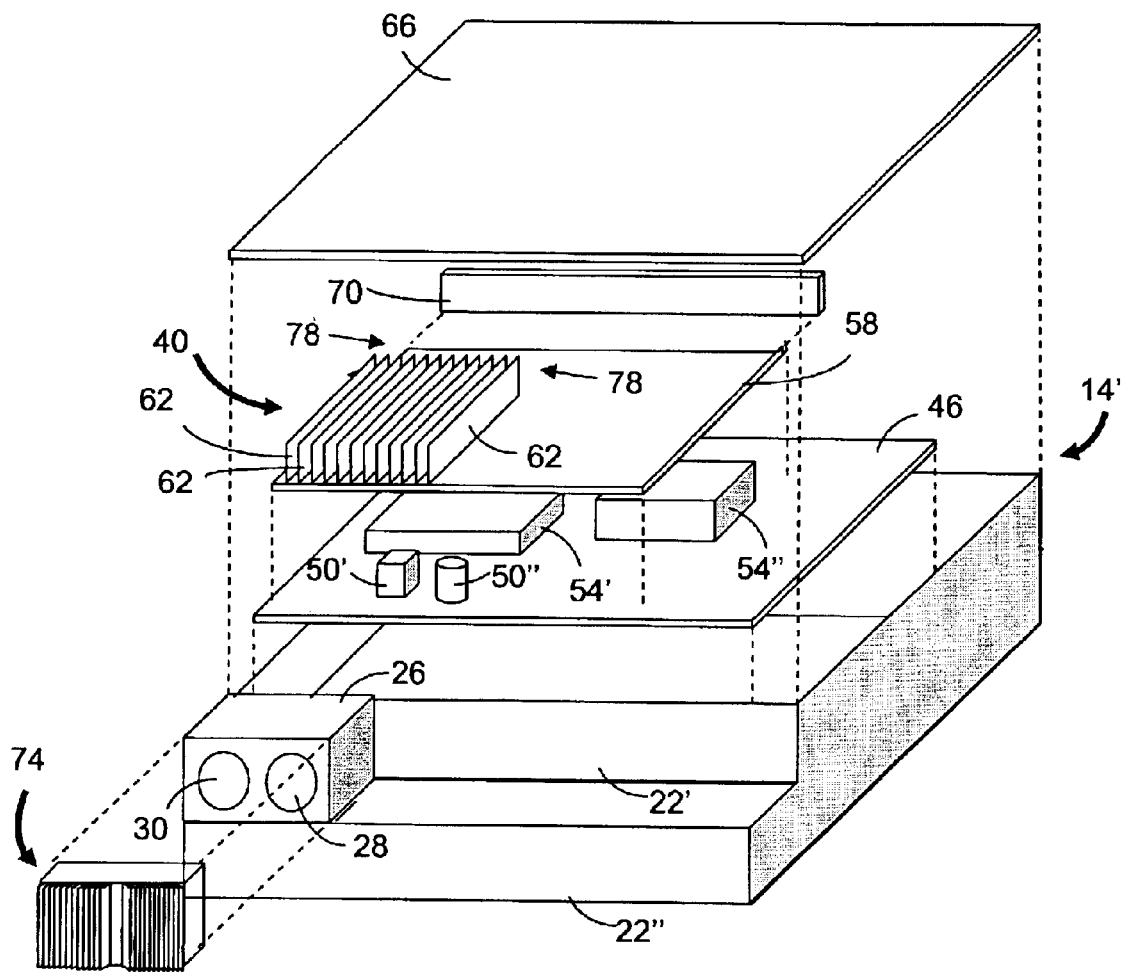
FIG. 3 is an exploded view of the electronics enclosure of FIG. 2B.

FIG. 3 shows an exploded view of the electronics enclosure 14' configured for front-to-front airflow as illustrated in FIG. 2B. The enclosure 14' substantially surrounds an electronics module that includes a circuit board 46 (e.g., printed circuit board (PCB)). Various components 50' and 50" (generally 50) and subsystems 54' and 54" (generally 54) are integrated to, or mounted on, the board 46. For example, components 50 can include electrical components (e.g., transformers, transistors, processors, memory devices, etc.) and optical components (e.g., pump lasers, pin diodes, array waveguides, filters, couplers, etc.) which generate heat that needs to be removed from the enclosure 14'. Subsystems 54 can include, for example, power supplies, multi-chip modules, daughterboards, optical modules and other subsystems.

The enclosure 14' also encloses a heat sink 40 that includes a thermal spreader plate 58 and multiple cooling fins 62. Because the heights of the components 50 and subsystems 54 vary, thermal shims may be attached to the bottom of the thermal spreader plate 58 to decrease the gaps between the plate 58 and the components 50 and subsystems 54. A thermally-conductive material (e.g., thermal putty) fills the space between each shim and the top of one of the components 50 or subsystems 54. Heat generated by the components 50 and subsystems 54 is thus conducted through the thermal spreader plate 58 and cooling fins 62. The enclosure 14' includes a cover plate 66 that closely fits over the top of the cooling fins 62. Thus cooling fins 62 are sealed on top by the cover plate 66 and on the bottom by the spreader plate 58, resulting in airflow channels between the cooling fins 62.

A removable flow deflector 70 is attached over one or more openings on the back panel (not shown) of the enclosure 14' using, for example, screws or snaps. In other embodiments, the removable flow deflector 70 is attached to the heat spreader plate 58, the electronics board 46 or the cover plate 70. The removable flow deflector 70 prevents the airflow generated by the inlet fan 28 from escaping and prevents the outlet fan 30 from drawing in air through the opening. The removable flow deflector 70 can be a plate that simply covers the opening. Alternatively, the removable flow deflector 70 can have a curved surface exposed to the airflow to decrease the flow loss as the airflow changes direction.

An optional louver module 74 mounts to the fan module 26. The louver module 74 controls the direction of the inlet airflow 34 and exhaust airflow 42 outside the enclosure 14'.

Referring to FIGS. 2B and 3, the fans 28, 30 generate the inlet airflow 34 through an inlet louver portion of the louver module 74. The inlet airflow 34 passes through some of the airflow channels defined by the cooling fins 62. The airflow 34, 42 "turns the corner" in the gap (region between arrows 78) between the back edge of the cooling fins 62 and the removable airflow deflector 70. The airflow 42 continues through other airflow channels between the cooling fins 62 and exits the enclosure 14' through an outlet louver portion of the lover module 74. To convert the enclosure 14' to a front-to-rear configuration, the removable flow deflector 70 is removed to expose the one or more openings in the back panel of the enclosure 14'. In addition, one of the fans 28, 30 is configured to reverse its direction of airflow by reversing the orientation of the fan 28, 30 on its axis or changing the polarity of the electrical power applied to the fan 28, 30.

Figure 4:
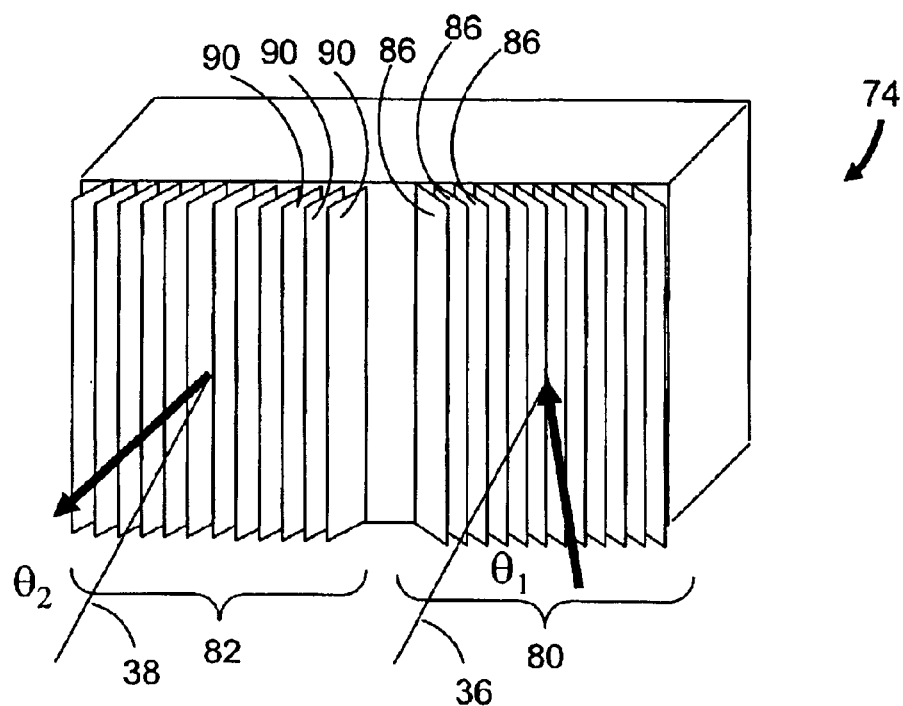
FIG. 4 is an illustration of a louver module for a thermal management apparatus in accordance with the present invention.

If the exhaust airflow 42, which is at a higher temperature than the inlet airflow 34, is sucked back into the enclosure 14' through the inlet fan 28, the cooling capacity of the thermal management apparatus is decreased. Recirculation of the exhaust airflow 42 does not occur if the fans 28, 30 are sufficiently spatially separated. If the inlet and exhaust fans 28, 30 are separated by only a few inches or less, it is desirable to include the louver module 74 to better separate the inlet and exhaust airflows 34, 42. Referring to FIG. 4, the louver module 74 includes an inlet louver 80 and an outlet louver 82. The inlet louver 78 has a set of vanes 86 that are tilted at an angle $\theta_1$, with respect to the inlet fan axis 36 and the outlet louver 82 has a set of vanes 90 that are tilted at an angle $\theta_2$ with respect to the outlet fan axis 38. Thus the inlet airflow 34 and exhaust airflow 42 generated by the fans 28, 30 are increasingly separated from each other with increasing distance from the enclosure 14'. This angular separation prevents the exhaust airflow 42 from being sucked back through the inlet fan 28 and recirculated through the enclosure 14'.

In conventional thermal management systems, the cooling airflow can deposit dust which accumulates on the enclosed electronics module over time. The dust acts as an insulating layer, making it difficult to cool the components and subsystems. Consequently, the enclosed electronics module can fail if the cooling efficiency continues to decrease in time. Many systems include air filters to prevent the buildup of dust, however, such systems require periodic cleaning or replacement of filters. In addition, such systems require more powerful fans to overcome airflow loss introduced by the air filter. The thermal management apparatus of the present invention maintains one volume within the enclosure that contains the electronics module and another volume for the cooling airflow. In the embodiment depicted in FIG. 3, the spreader plate 58 separates the two volumes. No significant dust is deposited on the components 50 and subsystems 54. Thus, no air filter is required and smaller capacity cooling fans 28, 30 can be utilized. Consequently, the cost of the enclosure 14' is reduced and no filter maintenance is necessary.

Figure 5:
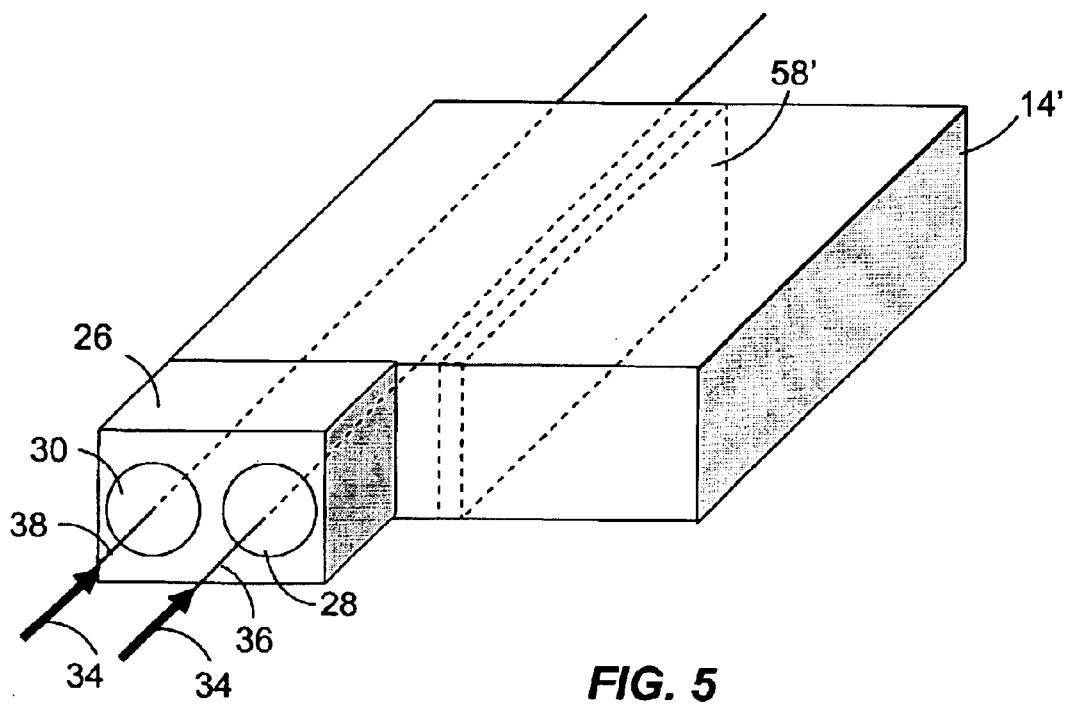
FIG. 5 is an illustration of an enclosure having an embodiment of a thermal management apparatus in accordance with the present invention.

The thermal management apparatus of the present invention is not limited to the above described structures. For example, the electronics volume and airflow volume can be separated by a vertically oriented thermal spreader plate 58' (shown in phantom) as depicted in FIG. 5. The electronics boards (not shown) can be vertically aligned (i.e., parallel) to the thermal spreader plate 58. In another example (not shown), one or more thermal spreader plates can be arranged horizontally for use with one or more horizontal circuit boards. The horizontal thermal spreader plates can be attached to, or be integral with, the vertical spreader plate 58'.

While the invention has been shown and described with reference to specific preferred embodiments, it should be understood by those skilled in the art that various changes in form and detail may be made therein without departing from the spirit and scope of the invention as defined by the following claims.

What is claimed is:

1. An apparatus for thermal management of an electronics module comprising:
   a first fan generating an inlet airflow and an exhaust airflow along a first fan axis;
   a second fan generating an inlet airflow and an exhaust airflow along a second fan axis, the second fan axis being substantially parallel to the first fan axis;
   a flow director disposed in the exhaust airflow of the first fan axis, the flow director redirecting the exhaust airflow of the first fan to the second fan along the second fan axis;
   a heat sink having a first portion disposed in at least one of the exhaust airflow of the first fan and the inlet airflow of the second fan, the heat sink having a second portion adapted for thermal coupling with the electronics module; and
   an enclosure surrounding the heat sink and the electronics module, the heat sink and the enclosure defining a first volume and a second volume, the first volume including the exhaust airflow of the first fan and the inlet airflow of the second fan, the second volume including the electronics module and being isolated from the airflows generated by the first fan and the second fan.

2. The apparatus of claim 1 wherein first portion of the heat sink comprises a plurality of cooling fins.

3. The apparatus of claim 1 further comprising:
   a first louver disposed in the inlet airflow of the first fan and being configured at a first angle with respect to the first and second fan axes; and
   a second louver disposed in the exhaust airflow of the second fan and being configured at a second angle with respect to the first and second fan axes, the second angle being opposite said first angle,
   wherein the inlet airflow of the first fan and the exhaust airflow of the second fan are spatially separate.

4. The apparatus of claim 1 wherein the second portion of the heat sink comprises a thermal spreader plate that separates the first volume and the second volume.

5. A reconfigurable apparatus for thermal management of an electronics module comprising:
   a first fan generating an airflow along a first fan axis;
   a second fan generating an airflow along a second fan axis, the second fan axis being substantially parallel to the first fan axis, the airflow from the second fan being in the same direction as the airflow from the first fan when the reconfigurable apparatus is in a first configuration, the airflow from the second fan being in an opposite direction from the airflow from the first fan when the reconfigurable apparatus is in a second configuration;
   a removable flow deflector disposed on the first fan axis when the reconfigurable apparatus is in the second configuration, the removable flow director directing the airflow of the first fan to the second fan along the second fan axis when the reconfigurable apparatus is in the second configuration; and a heat sink having a first portion disposed in at least one of the airflow of the first fan and the airflow of the second fan, the heat sink having a second portion adapted for thermal coupling with the electronics module.

6. The reconfigurable apparatus of claim 5 wherein the first portion of the heat sink comprises a plurality of cooling fins.

7. The reconfigurable apparatus of claim 5 further comprising an enclosure surrounding the heat sink and the electronics module, the heat sink and the enclosure defining a first volume and a second volume, the first volume including the airflows generated by the first fan and the second fan, the second volume including the electronics module.

8. The reconfigurable apparatus of claim 7 wherein the second portion of the heat sink comprises a thermal spreader plate that separates the first volume and the second volume.

9. The reconfigurable apparatus of claim 5 further comprising:

a first louver disposed on the first fan axis and being configured at a first angle with respect to the first fan axis and second fan axis; and a second louver disposed on the second fan axis and being configured at a second angle with respect to the first fan axis and second fan axis, the second angle being opposite the first angle, wherein the airflow exhausted through the second louver does not interfere with the airflow received at the first louver.

10. A reconfigurable apparatus for thermal management of an electronics module comprising:

means for generating an airflow along a first axis;

means for generating an airflow along a second axis, the second axis being substantially parallel to the first axis, the airflow along the second axis being in the same direction as the airflow along the first axis when the reconfigurable apparatus is in a first configuration, the airflow along the second axis being in an opposite direction to the airflow along the first axis when the reconfigurable apparatus is in a second configuration;

removable means for directing the airflow along the first axis toward the means for generating an airflow along the second axis when the reconfigurable apparatus is in the second configuration; and means for transferring heat generated in the electronics module to at least one of the airflow along the first axis and the airflow along the second axis.

* * * * *